United States Patent
Verma et al.

(10) Patent No.: US 8,275,331 B2
(45) Date of Patent: Sep. 25, 2012

(54) PA GAIN STATE SWITCHING BASED ON WAVEFORM LINEARITY

(75) Inventors: Sumit Verma, San Diego, CA (US); Vijay K. Chellappa, San Diego, CA (US); Gurkanwal S. Sahota, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 350 days.

(21) Appl. No.: 12/631,615

(22) Filed: Dec. 4, 2009

(65) Prior Publication Data

US 2010/0308909 A1 Dec. 9, 2010

Related U.S. Application Data

(60) Provisional application No. 61/171,299, filed on Apr. 21, 2009.

(51) Int. Cl.
*H04B 1/04* (2006.01)
(52) U.S. Cl. .............. 455/127.2; 455/115.1; 455/126; 455/127.1; 455/232.1; 455/522
(58) Field of Classification Search .......... 455/127.2, 455/115.1, 126, 127.1, 232.1, 522
See application file for complete search history.

(56) References Cited

U.S. PATENT DOCUMENTS

| 6,018,232 A * | 1/2000 | Nelson et al. ............... 320/127 |
| 6,615,028 B1 | 9/2003 | Loke et al. |
| 6,735,420 B2 * | 5/2004 | Baldwin ................... 455/127.2 |
| 2007/0173276 A1* | 7/2007 | Love et al. ................ 455/522 |
| 2008/0139146 A1* | 6/2008 | Behzad ................... 455/127.2 |
| 2008/0305824 A1* | 12/2008 | Haim et al. ............... 455/522 |
| 2010/0067513 A1* | 3/2010 | Murata ..................... 370/342 |
| 2010/0150126 A1* | 6/2010 | Scholand et al. .......... 370/342 |
| 2011/0274092 A1* | 11/2011 | Liu et al. ................... 370/335 |

FOREIGN PATENT DOCUMENTS

WO WO2008130693 10/2008

OTHER PUBLICATIONS

International Search Report and Written Opinion—PCT/US2010/031961, International Search Authority—European Patent Office—Jul. 14, 2010.

* cited by examiner

*Primary Examiner* — Sanh Phu
(74) *Attorney, Agent, or Firm* — Ramin Mobarhan

(57) ABSTRACT

Techniques for optimizing the power consumption of existing low cost multi-gain state power amplifiers (PA) to increase the talk time of wireless communication devices are described. In an exemplary embodiment a device, such as a baseband processor, operates to set a multistage PA having at least two gain states for amplifying a transmit signal to a lowest power consuming gain state. The device calculates a transition power level as a function of an identified maximum power reduction (MPR) value and switches the PA to a higher gain state from a lower gain state when a transmission power level is higher than the calculated transition power level.

27 Claims, 4 Drawing Sheets

PA GAIN STATE SWITCHING BASED ON WAVEFORM LINEARITY

CLAIM OF PRIORITY UNDER 35 U.S.C. §119

The present Application for patent claims priority to Provisional Application No. 61/171,299, entitled ""WAVEFORM VARIABLE PA SWITCHPOINTS IMPLEMENTATION IN UE WITH MULTI GAIN STATE PA FOR LOW COST BATTERY LIFE OPTIMIZATION" filed Apr. 21, 2009, and assigned to the assignee hereof and hereby expressly incorporated by reference herein.

TECHNICAL FIELD

The present disclosure relates to electronics and more particularly to the optimization of the transmitter power consumption and therefore talk time of wireless communication devices.

BACKGROUND

Radio-frequency (RF) signals generated at a mobile handset generally are amplified, transmitted through a handset antenna and sent to a base station for distribution to receivers. Often the frequency bands of operation of the handsets are predetermined, mainly in the frequency range from 450 MHz to 2.6 GHz for various mobile standards such as WCDMA (wide band code division multiple access) and CDMA (code division multiple access).

In general, the handset is required to transmit at a high output power level when it is farther away from a receiving base station in order to maintain a predetermined signal strength at the base station for sufficient reception. Conversely, the closer the handset to the base station, less transmitted power would be required. A handset's output power is adjusted using the command embedded within the RF control signal transmitted from the base station to the handset.

The handset transmitted signal, and hence the RF power amplifier output signal, has to meet the government regulations on spectral re-growth (also known as linearity—often measured in terms of adjacent channel leakage power ratio (ACLR) which stipulates the maximum allowable interference to other frequency channels in order to minimize interference between signals).

Some known mobile devices (handsets) have RF power amplifiers powered by the full battery voltage at all times. RF power amplifiers are generally designed to meet the linearity specification at maximum transmit power level (e.g., +28 dBm in certain WCDMA mobile handsets) under such a bias condition. Statistically, power amplifiers transmits at maximum linear output power only for a small fraction of time, while most of the transmissions take place at a considerably lower power levels (10-20 dB below maximum power).

The actual output power level from the power amplifier (and hence the handset), is continuous from some −50 dBm to 28 dBm. Multi-gain state power amplifiers, compared to conventional single-path power amplifiers, consume less current at low power outputs.

Multi-gain state power amplifiers are commonly implemented with two or three power gain states. In a three gain state solution the three states include high power (HP), medium power (MP), and low power (LP). For an example normal WCDMA waveform, the HP gain state might be set to a desired max output power range of 16 dBm to 28 dBm, the MP gain state might be set from 8 dBM to 16 dBM, and the LP gain state might be set for all power levels below 8 dBm. In short, multi-gain state power amplifiers are implemented with two, three (or more) power paths, each for delivering a certain predetermined max output power at a fixed gain. A switch point (in dBm) is value which defines a transition power level at which the handset is to switch (jump) from one PA gain state to the one above it or below it. At present, multi-gain state PAs do not dynamically change this PA switch point to account for inherent differences of transmitted waveform, such as linearity differences.

As mentioned, spectral re-growth can occur when the PA is forced to operate in a non-linear region, which occurs when driving the PA near its 1 db compression point. Spectral re-growth therefore describes the increase in out-of-band signal energy at the power amplifier output due to non-linear amplifier effects. Spectral re-growth is most pronounced within a channel adjacent to a desired transmit channel. For UMTS, the requirement on the power amplifier is defined by an Adjacent Channel Leakage Ratio (ACLR) at +/−5 MHz of the desired channel. The voltage gain characteristic of the power amplifier may be characterized as follows:

$$v_o(t) = g_1 \cdot v_i(t) + g_2 \cdot v_i(t)^2 + g_3 \cdot v_i(t)^3 + \ldots + g_n \cdot v_i(t)^n \qquad \text{Equation (1)}$$

where $g_1 \cdot v_i(t)$ is the linear gain of the amplifier and the remaining terms (i.e., $g_2 \cdot v_i(t)^2 + g_3 \cdot v_i(t)^3 + \ldots + g_n \cdot v_i(t)^n$) represent the non-linear gain. If the signal carries a modulated third Generation Partnership Project (3GPP) Radio Frequency (RF), then the non-linear terms will be generated as a result of inter-modulation distortion, resulting in in-band distortion terms causing an increase in Error Vector Magnitude (EVM) and out-of-band distortion causing an increase in ACLR.

Multi-code signals, such as those in UMTS Release 5, 6 and 7, as well as those in certain LTE specifications (e.g., 3GPP Release 8), exhibit an increase in peak-to-average power resulting in larger dynamic signal variations. These increased signal variations require increased amplifier linearity, resulting in increased power consumption. Recent results have shown that it is not efficient to directly transfer dB for dB (i.e., the ratio of peak power to average power of a signal, also known as peak-to-average ratio (PAR)) to amplifier power reduction. Analysis of the amplifier spectral re-growth has shown that the $3^{rd}$ order non-linear gain term ("cubic gain") is the dominant cause of ACLR increase. The total energy in the cubic term is dependent on the statistical distribution of the input signal.

With the introduction of High Speed Uplink Packet Access (HSUPA), a new method of estimating amplifier power reduction called the Cubic Metric (CM) was introduced in Release 6. The CM is based on the amplifier cubic gain term. The CM describes the ratio of the cubic components in the observed signal to the cubic components of a 12.2 kbps voice reference signal. The CM applies to both High Speed Downlink Packet Access (HSDPA) and HSUPA uplink signals. Statistical analysis has shown that the power de-rating based on an estimation of the CM exhibits a significantly smaller error distribution when compared to power de-rating based on 99.9% PAR, where the error distribution is the difference between the actual power de-rating and the estimated power de-rating.

3GPP specifies a Maximum Power Reduction (MPR) test which verifies that the maximum transmit power of a mobile handset is greater than or equal to the nominal maximum transmit power less an amount herein termed "maximum-MPR," where maximum-MPR is a function of the transmitted signal's CM.

A handset must know the value of CM in order to compute the selected MPRs and, if required, (i.e., if the handset is operating at near maximum power), ultimately use this information to actually set the transmit power at a transmit power level which is backed off from max power level by an amount equal to MPR. Even if the receiving base station cannot receive the transmit signal at this lower (backed off) transmit power level, the standard allows for the handset to transmit at lower power levels. Because the PA is already at the highest gain state and max output power level, it cannot switch up to any next higher gain state or power level.

Any multi-code signal (characterized by the physical channels being transmitted, their channelization codes and weights called β terms) has its particular CM and PAR. In UMTS, the signal, and thus the CM and PAR, can change every 2 or 10 msec Transmit Time Interval (TTI). It can be shown that for Release 6 UMTS there are over two hundred thousand combinations of physical channel parameters and quantized β terms; each such combination is herein termed a possible signal. It is therefore necessary for a handset to look up CM or PAR (by way of a look up table or the like) or either measure or estimate these values within some allowable error from the signal's characteristic parameters. Nevertheless, measuring CM or PAR from an actual signal is well known.

Voice waveforms are typically associated with high linearity, which means that any associated linearity metric (e.g. cubic metric, PAR, etc) is high relative to data waveforms. Data waveforms, on the other hand, have a large range of linearity metrics.

Existing PA implementations do not distinguish between voice and data waveforms, or between more and less linear waveforms to adjust the switch point to account for the linearity difference between them. This unfairly results in both voice and data waveforms being switched based on predetermined switch points independent of any linearity characteristic of the underlying transmit waveform. When a lower gain state would be more optimum at a predetermined transmit power level, battery resources are wasted.

Multiple vendors offer competing multi-gain state PA solutions. A handset integrator selects a best solution for a given reference design thus being free of the burden of designing its own PA solution. One disadvantage of this is that the PA may not be completely optimized to provide optimum power utilization. For example, PA solutions configured for multi-mode, multi-media capable mobile device applications, may be optimized for voice instead of data usage, or at less than optimum power transition levels for a particular phone configuration. On the other hand, existing off-the-shelf solutions being low-cost, already proven solutions that are easy to integrate, the trade-off in efficiency is oftentimes an acceptable or only cost effective option for an integrator.

Table 1 below illustrates example PA characteristics of an example multi-gain state PA designed for use in a WCDMA mobile device. The example multi-gain state is designed to operate across the three PA gain states, each of which is associated with a specific maximum power output level and a specific gain value.

TABLE 1

| Characteristic | Condition | Value |
| --- | --- | --- |
| Gain | High Power Gain State (HP) Maximum Output Power = 28.0 dBm | 26 dB |
| | Mid Power Gain State (MP) Maximum Output Power = 16.0 dBm | 16 dB |
| | Low Power Gain State (LP) Maximum Output Power = 8.0 dBm | 15 dB |

TABLE 1-continued

| Characteristic | Condition | Value |
| --- | --- | --- |
| Total Supply Current | High Gain State Maximum Output Power = 28.0 dBm | 465 mA |
| | Mid Gain State Maximum Output Power = 16.0 dBm | 72 mA |
| | Low Gain State Maximum Output Power = 8.0 dBm | 31 mA |
| Quiescent Current | High Gain State Maximum Output Power = 28.0 dBm | 97 mA |
| | Mid Gain State Maximum Output Power = 16.0 dBm | 14 mA |
| | Low Gain State Maximum Output Power = 8.0 dBm | 11 mA |

As can be seen from Table 1, operating the multi-gain state PA at a lower possible gain stage consumes significantly less current. Hence, a baseband processor—which typically sets the operating state of the PA during phone operation—must select the best power gain state to set the PA to in order to optimize power consumption without compromising transmit signal degradation, adjacent channel leakage, and the like either required by the network operator, and/or required to meet the technical specifications of the product as defined by an associated standard specification, or government imposed signal interference rules and regulations.

In certain wireless communication protocols, such as WCDMA for example, a handset or like portable device must be able to switch, based on predetermined switch points, to the appropriate output power level and specific gain state.

A baseband processor in the handset typically determines and then sets the gain state of the three gain state PA by toggling a two bit digital input (e.g., IC pins Vmode0 and Vmode1). A two gain state PA device may require a one bit digital input instead.

In WCDMA, the baseband processor may perform rate selection to control or reduce power leakage to the adjacent channel that can be caused by the handset. Rate selection involves selecting a data rate and coding scheme for the intended signal transmission or burst as a way to control PA response.

The baseband processor programs the handset transmitter circuitry so as to set up the necessary transmitter configuration to enable the uplink transmission. Transmitter configurations can be characterized by one or more channels in the code, frequency, or time domain or any combination thereof and may include other attributes such as channel modulation type.

An uplink transmitter configuration for WCDMA may be characterized by two or more code channels with differing modulation, spreading factor, channelization code, and I or Q branch assignments. For example, a multi-channel WCDMA uplink transmission might include (i) a dedicated physical control channel (DPCCH), (ii) a dedicated physical data channel (DPDCH), (iii) a high speed dedicated physical control channel (HS-DPCCH), (iv) an enhanced dedicated physical control channel (E-DPCCH), and (v) an enhanced dedicated physical data channel (EDPDCH), to support a single transmission link event.

In a multi-mode device capable of supporting newer, as well as older, releases of a wireless protocol, as well as multi-mode devices capable of supporting other wireless protocols (e.g., CDMA 1x, CDMA2000, OFDM, etc.), the number of possible transmitter configurations can be quite large.

It is known that a given transmitter configuration is likely to cause a PA to behave more or less linear than another transmitter configuration. For this reason, protocols, such as WCDMA, require the baseband processor to assume a worst case peak to average power response for a given uplink transmission, and to account for this by requiring the handset to account for MPR, as previously explained.

In terms of signal gain, there might be very little actual power gain difference between a lower gain state and the next higher gain state. Referring to Table 1, the difference in actual power gain (i.e., Pout/Pin) between low and mid gain states is only 1 dB for example.

Once the necessary transmitter configuration is set, the waveform characteristics of an uplink transmit signal can vary depending on the type of signal being transmitted.

The main problem with a multi-gain state PA is the difficulty (in terms of high design costs) to change bias and reference voltages to set the PA to account for non-linearity variations throughout its transmit power dynamic range.

One known approach to account for non-linearity variations generally is to utilize a single gain state PA which is externally driven by a variable switch mode power supply (SMPS). An SMPS varies the voltage supplied to the PA more accurately over a desired transmit dynamic range, thus improving battery referred current due to the efficiency of the SMPS. An SMPS is a bulky, expensive component and for this reason is intentionally avoided. Also, using an SMPS requires calculating the associated linearity metric for each waveform on the fly, and generating appropriate signals to program the SMPS, in order to set any bias, reference, and the like PA settings which will in turn tune the PA to a desired gain state.

It is highly desirable to be able to more efficiently switch between gain states of a multi-gain state PA to account for waveform non-linearity characteristics.

Figure 1:
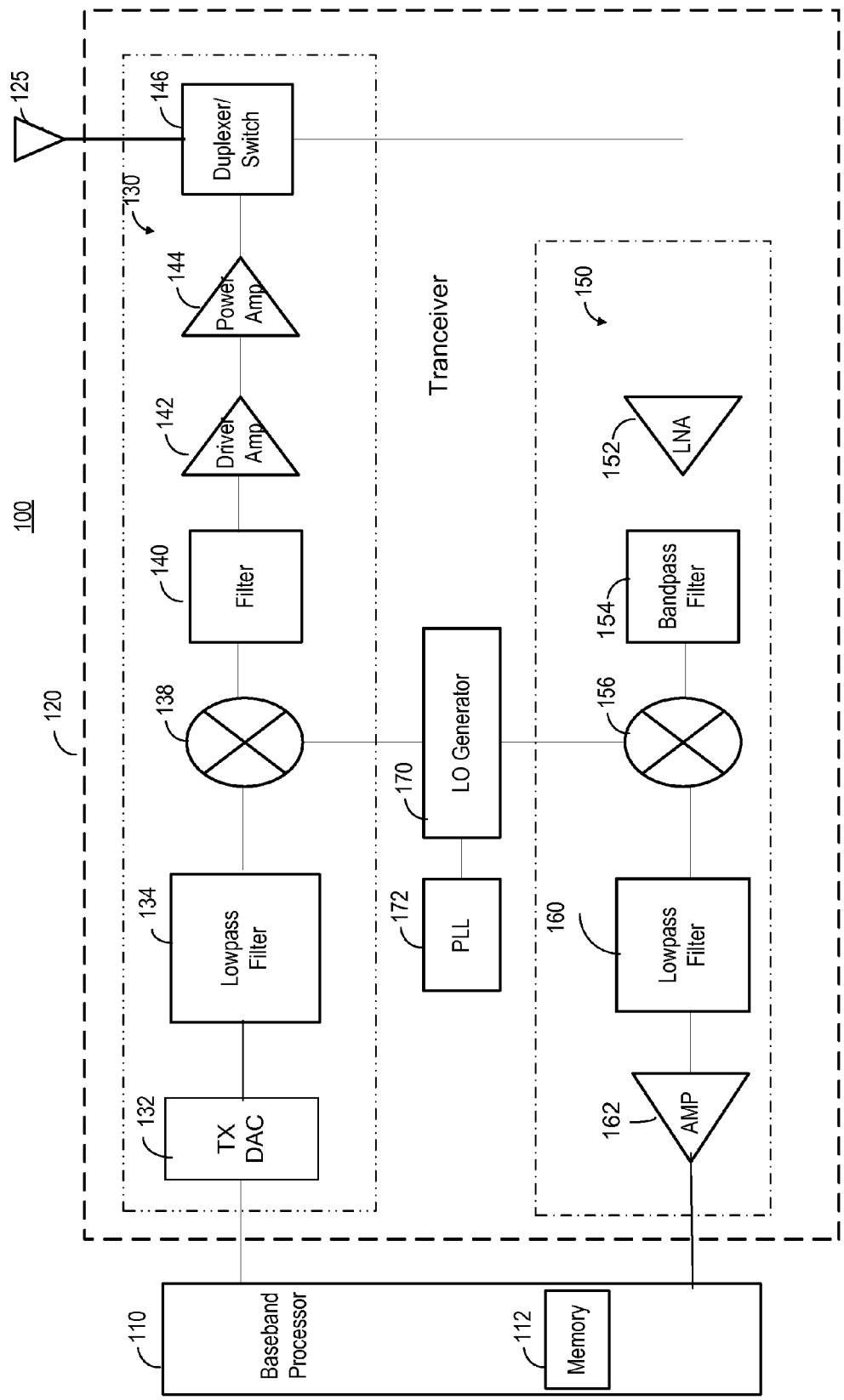
FIG. 1 shows a system level block diagram of a wireless communication device.

To facilitate understanding, identical reference numerals have been used where possible to designate identical elements that are common to the figures, except that suffixes may be added, where appropriate, to differentiate such elements. The images in the drawings are simplified for illustrative purposes and are not necessarily depicted to scale.

The appended drawings illustrate exemplary configurations of the disclosure and, as such, should not be considered as limiting the scope of the disclosure that may admit to other equally effective configurations. Correspondingly, it has been contemplated that features of some configurations may be beneficially incorporated in other configurations without further recitation.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The present disclosure describes techniques for more accurately switching between the gain states of a multi-gain state PA taking into account an actual waveform linearity characteristic of the transmit signal.

FIG. 1 shows a system level block diagram of wireless communication device 100. Wireless communication device 100 may configured to allow it to control PA gain states in accordance with the embodiments to be described below.

Wireless communication device (WCD) 100 can be a handset, a portable device, user equipment (UE), a modem device or any similar such device.

WCD 100 includes baseband processor (BB) 110, transceiver 120, and antenna 125. Transceiver 120 comprises transmitter 130, receiver 150, LO Generator 170, and PLL 172, which together provide support for bi-directional wireless communication over a wireless channel to a remote terminal device or base station.

In general, WCD 100 may include a plurality of transmitters 130 and a plurality of receivers 150 to support multiple protocols and simultaneous multi-mode communications across multiple frequency bands. Each transceiver may comprise one or more transmit and received paths, and may include only one and not the other type of path.

WCD 100 selects the desired transmitter configuration necessary to transmit a waveform (data or voice).

In an example transmitter configuration, transmitter 130 receives a digital output signal from BB 120. This signal is first fed to a digital-to-analog converter (DAC) (132) and then filtered by an analog filter, such as low pass filter 134, to remove any images introduced by the digital to analog conversion. The output from low pass filter 134 is then upconverted from baseband level to RF by mixer 138 and the upconverted RF signal is filtered by filter 140. The output from filter 140 is further amplified by driver amplifier (DA) 142 and ultimately fed to power amplifier (PA) 144. The output from PA 144 is routed through duplexer/switch 146 and finally transmitted via antenna 125.

In the example receive path as shown, antenna 125 receives signals from base stations and provides a received signal. This signal is routed through duplexer/switch 146 and provided to receiver 150. Within receiver 150, the received signal is amplified by an LNA 152, filtered by a band pass filter 154, and downconverted from RF to baseband by mixer 156. The downconverted baseband signal is filtered by an analog filter, such as low pass filter 160, and amplified by amplifier 162 to obtain an analog input signal which is then input to BB 110. In alternate configurations, the input and outputs to/from BB 110 are both digital and/or both analog signals, or some combination of the two.

As shown in FIG. 1, transmitter 130 and receiver 150 implement a direct conversion architecture that frequency converts a signal between RF and baseband in one stage. Transmitter 130 and/or receiver 150 may also implement a super-heterodyne architecture, which frequency converts a signal between RF and baseband in multiple stages.

Local oscillator (LO) generator 170 generates and provides transmit and receive LO signals to mixers 138 and 156, respectively. Phase locked loop (PLL) 172 receives control information from BB 110 and provides control signals to LO generator 170 to generate transmit and receive LO signals at the proper frequencies.

In general, the conditioning of the signals in transmitter 130 and receiver 150 may be performed by one or more stages of amplifier, filter, mixer, etc. These circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. All or a portion of transceiver 120 may be implemented on an analog integrated circuit (IC), an RF IC (RFIC), a mixed-signal IC, etc. For example, amplifier 132 through driver amplifier 142 in transmitter 130 may be implemented on an RFIC whereas power amplifier 144 may be implemented external to the RFIC.

BB 110 may perform various functions for wireless communication device 100, e.g., digital processing for transmitted and received data. A memory 112 may store program codes and data for BB 110. BB 110 may be implemented on one or more application specific integrated circuits (ASICs) and/or other ICs.

As shown in FIG. 1, a transmitter and a receiver may include a number of different amplifiers. Each amplifier may be implemented in various manners. Unless preset, BB 110 is typically set up to control the gain level or gain state and output power level of each amplifier.

BB 110 chooses a data rate and coding scheme (e.g., based on rate selection) for a signal transmission or burst over a wireless channel for a given transmitter configuration. BB 110 also will compute a maximum power reduction (MPR) based on the generated waveform for the given transmitter configuration, in a known manner. MPR is usually defined by the associated wireless communications protocol (e.g., 3GPP standards) to control how much WCD 100 must back off from a maximum transmission power (MTP), or used to adjust the MTP, in order to establish a modified MTP which is used during the transmission of the corresponding waveform thus ensuring that adjacent channel leakage levels stay within a specified or targeted limit.

WCD 100 may also compute the MPR based on the cubic metric of a waveform generated for a specific transmitter configuration. The number of transmitter configurations can be quite large and each configuration has a corresponding MPR. During rate selection, data rate, coding scheme, and transmitter configuration, among other parameters, are determined using known techniques. As a result, both the waveform and the transmitter configuration are known before signal transmission. This information may be used to therefore compute or determine MPR and apply it to determine maximum transmit power levels in time for transmission of the waveform.

Until now, MPR has been used only to determine how much to backoff the maximum power level rating of the PA at the high end of the power curve, i.e., the power provided at the HP gain state. MPR has not been used to set the switch points or otherwise control when the PA switches from one gain state to the next as a function of MPR or some other linearity characteristic of the transmit signal waveform.

As was explained above, wireless communication protocols, such as those based on 3GPP protocols, require calculation of MPR. MPR scores or values are divided into group or 'bin' waveforms in MPR increments of 0.5 dB or 1 dB steps depending on the particular 3GPP standard. In 3GPP 25.101 release 5 (HSDPA), for example, max power back-off is correlated to specific waveform linearity characteristics set out in a table of different 'bins' in 1.0 dB increments. Similarly, 25.101 release 6 (HSUPA) and onwards use a 'cubic metric' to compute a value which is then used to assign the waveform a "max power reduction" value from a bin of max power back-off values separated in 0.5 dB increments. Also, 36.101 release 8 (LTE) defines MPR using waveform properties via a table of MPR values set out in 1.0 dB 'bins'. It should be appreciated that for purposes of this disclosure, the terms MPR and max power back-off shall be used interchangeably to refer to any value (or set of values) the purpose of which is to define a max power back-off parameter.

In accordance with an exemplary embodiment, WCD 100 (and in particular baseband processor 110) uses the predetermined or calculated MPR value to not only adjust down the maximum allowed transmission power of the wireless communication device 100, but to also define a more optimum switch point to switch the PA from a lower power gain state to the next power gain state level. Because MPR is known a priori, no additional resources are expanded by the BB processor to recalculate. (However, it should be appreciated that calculating MPR or some other waveform related characteristic metric, including cubic metric, PAR, any combination of metrics, or the like either on the fly or using look up tables, and using same to set or move the switch point, as contemplated herein, are equally applicable alternatives to using known MPR values.)

Figure 2:
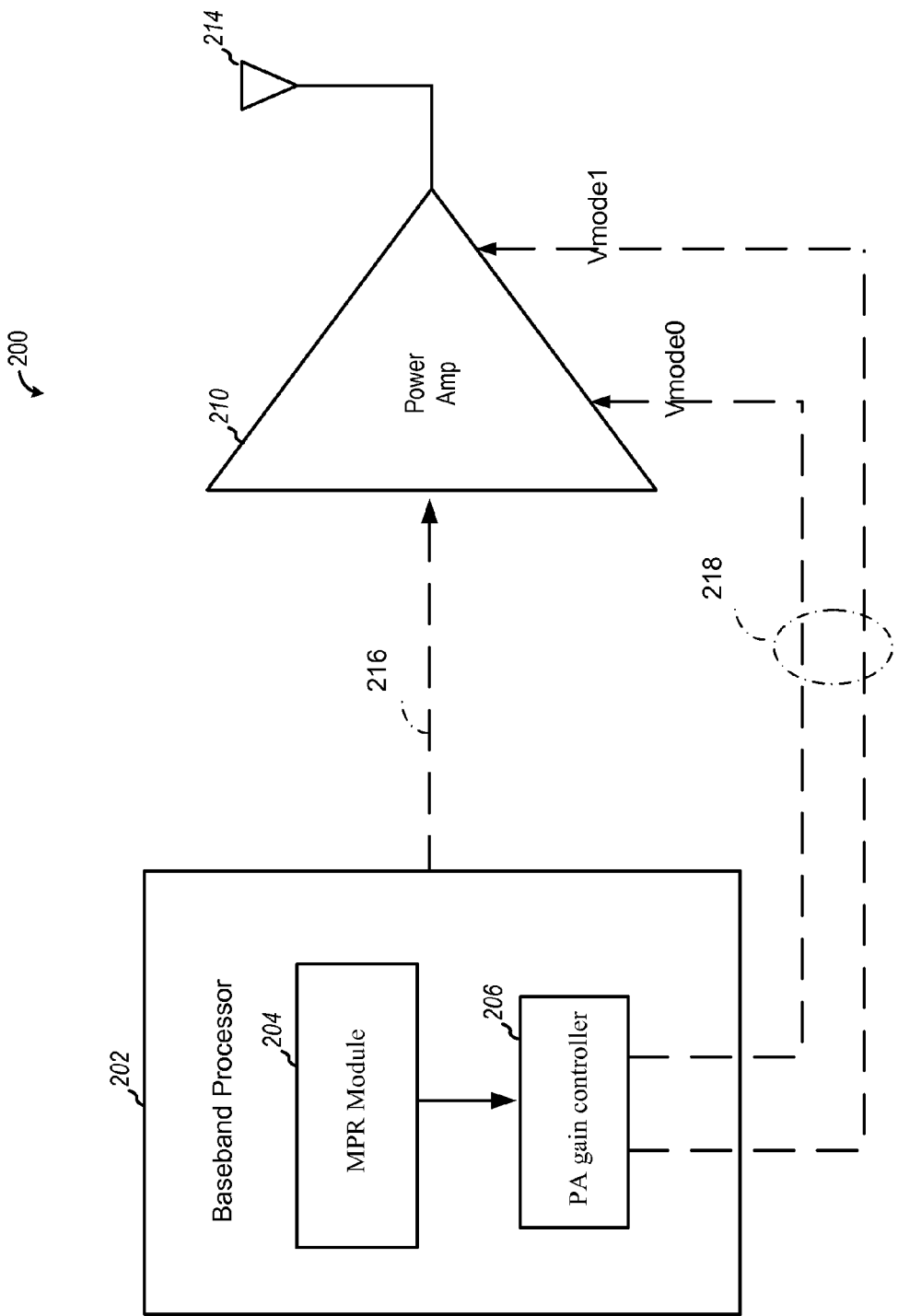
FIG. 2 shows a lower level block diagram of logic circuitry for calculating and switching between gain states of a multi-gain state power amplifier using MPR in accordance with an exemplary embodiment.

FIG. 2 shows a lower level block diagram of logic circuitry for calculating and switching between gain states of a multi-gain state power amplifier using MPR in accordance with an exemplary embodiment.

Here, a baseband processor 202 (corresponding to BB 110 in FIG. 1) is shown comprising an MPR module 204 coupled to a PA gain controller 206. Baseband processor 202 is in turn programmably coupled to multi-gain state power amplifier (PA) 210 (corresponding to PA 144 in FIG. 1) via PA gain controller 206. PA gain controller 206 generates PA control signal 218 which toggle PA gain state control state signals (Vmode0, Vmode1) to set the PA to the desired gain state or to change to a new (higher or lower gain state) in accordance with the exemplary embodiments set out below.

An output of PA 210 is coupled to antenna 214 to facilitate transmitting of modulated waveform into space.

Baseband processor 202 feeds the transmit signal to multi-gain state PA 210, through a transmit path 216 (shown in dotted lines and corresponding substantially to the transmit path of FIG. 1.

In one exemplary embodiment, MPR module 204 generates MPR values for one or more transmit signals based on a signal's associated communication protocol in a known manner to determine max transmission power level at the high end of signal power transmission. The same values are then provided to PA gain controller 206. PA gain controller uses the received MPR values to determine whether it is appropriate to shift the switch point by an MPR based value. This is to account for the fact that at a current power gain state level and for a preset switch point, a waveform characterized with more or less linearity can allow the transmit signal to be received without much additional distortion by a receiver without having to switch to a higher gain state.

Figure 3:
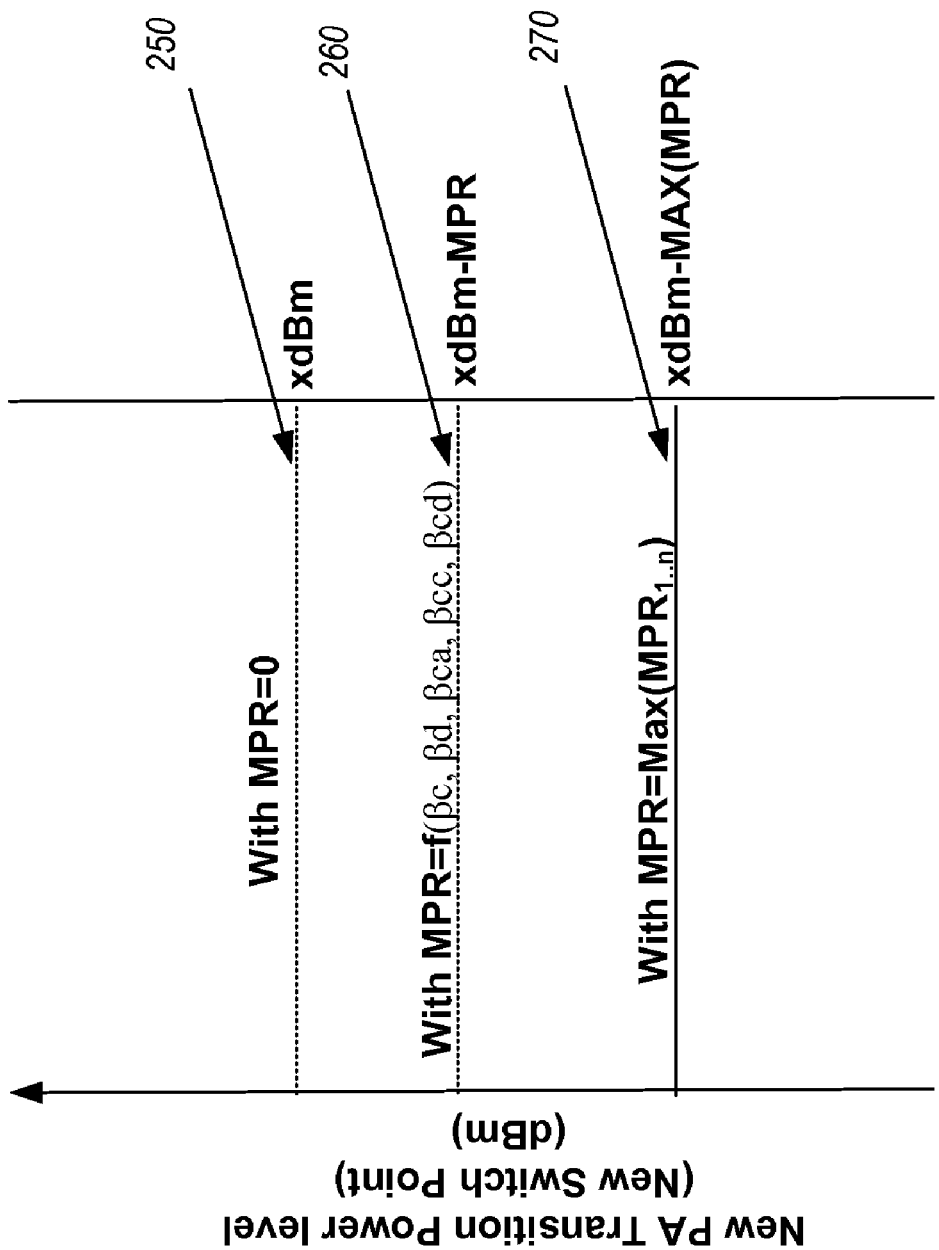
FIG. 3 shows example switch point values based on MPR values associated with waveforms of different linearity in accordance with the exemplary embodiment.

FIG. 3 graphically shows example switch point values based on MPR values associated with waveforms of different linearity in accordance with the exemplary embodiment.

Each PA transition power level corresponds to a different PA switch point value. Three switch point values are shown, each based on PA transition power level when MPR=0 (line 250), PA transition power level when MPR is greater than zero (0) but less than a maximum MPR value (=MAX(MPR)) (line 260), and PA transition power level when MPR is equal to MAX(MPR) (line 270). For reference purposes, a base or initial switch point value of x dBM at MPR=0 is assumed at line 250.

Each of the three switch value states represents a new point at which PA gain controller 206 will select when to shift PA 210 from a lower gain state to a higher gain state, and vice versa. Because switch point values are based on MPR, which in turn are associated with linearity metrics of the transmit signal, it is possible to shift the switch point to a state which shifts up a first threshold at which the PA needs to move to a higher gain state when the transmit waveform is more linear and shift down a second threshold at which the PA needs to move to a higher gain state when the transmit waveform is less linear. In one scenario, the first and second thresholds are the same value and correspond to switch point value x dBm. In another scenario, the first and second thresholds are the same and correspond to the maximum output power level at each gain state.

New switch point thresholds can be expressed numerically as follows:

$$\text{New switch point threshold (dBm)} = \quad \text{Equation (2)}$$
$$\text{New Transition Power Level (dBm)} =$$
$$x \text{ dBm} - MPR \text{ value (dB)}$$

MPR values are derived based using the relevant beta coefficients associated with a given transmit signal waveform. Accordingly, equation (2) may be better expressed as follows:

$$\text{New switch point threshold (dBm)} = \quad \text{Equation (3)}$$
$$\text{New Transition Power Level (dBm)} =$$
$$x \text{ dBm} - MPR \text{ value } (\beta c, \beta d, \beta ca, \beta cc, \beta cd) \text{ (dB)}$$

In addition to using MPR as defined in 3GPP, it is possible to change the binning or grouping of waveforms to associate or group them into different bins than those typically defined by, for example, 3GPP standards.

In an example alternate embodiment, MPR values are binned based on linearity factors, such as cubic metric calculations. In the case of voice waveforms, for example, voice waveforms have a cubic metric result one (1) dB lower than that of any highest linearity data waveform that might be transmitted. However, 3GPP standards 'bin' Re199 WCDMA voice together with such data waveforms; both are treated as belonging to bin MPR=0.

To account for this linearity MPR value imbalance, a special 'bin' might be created and assigned a value MPR=−1. Voice waveforms would be automatically assigned to bin MPR=−1 and the MPR value of minus one (−1) used to calculate the new switch point as per equations 2 and 3 above. The rest of the implemented bins may be implemented identical to 3GPP MPR bins, or changed to account for other factors which would allow the baseband processor to reduce power consumption by controlling when the PA should be switched between states.

An example 25.101 Release 6 (HSUPA) implementation, implemented using a Release99 voice bin, may include the following total bins: MPR=−1 dB, MPR=0 dB, MPR=0.5 dB, MPR=1.0 dB, MPR=1.5 dB, MPR=2.0 dB, and MPR=2.5 dB.

Each of the above waveform 'bins' will have its own unique PA switch-point power level in the three-gain state PA example to go from low to high PA gain state and vice versa.

This allows switching each 'bin' of waveforms to their max linearity capability, hence, optimizing the linearity capability of the designed PA gain state to achieve good current consumption at desired power level for more waveforms.

Hence, PA gain controller 206 switches the multi-gain state PA to a higher gain state only when the MPR value of the transmit waveform requires the multi-gain state PA to switch to the next gain state to support the transmit waveform linearity requirements. Or vice versa, the PA gain controller will switch the multi-gain state PA to a lower gain state when the waveform MPR value is low enough to allow the waveform to be transmitted linearly by the multi-gain state PA operating at a lower gain state.

Those of skill will appreciate that the 'binning' can be in accordance to the MPR or any other similar linearity metric.

Example binning based on current 3GPP standards are as set below.

25.101 release 5 (HSDPA) defines MPR using waveform properties via a table assigning waveforms to bins in 1.0 dB 'bin' increments.

25.101 release 6 (HSUPA) and onwards uses 'cubic metric' to compute MPR and assign waveforms in 0.5 dB 'bins' increments.

36.101 release 8 (LTE) defines MPR using waveform properties via a table in 1.0 dB 'bin' increments.

Figure 4:
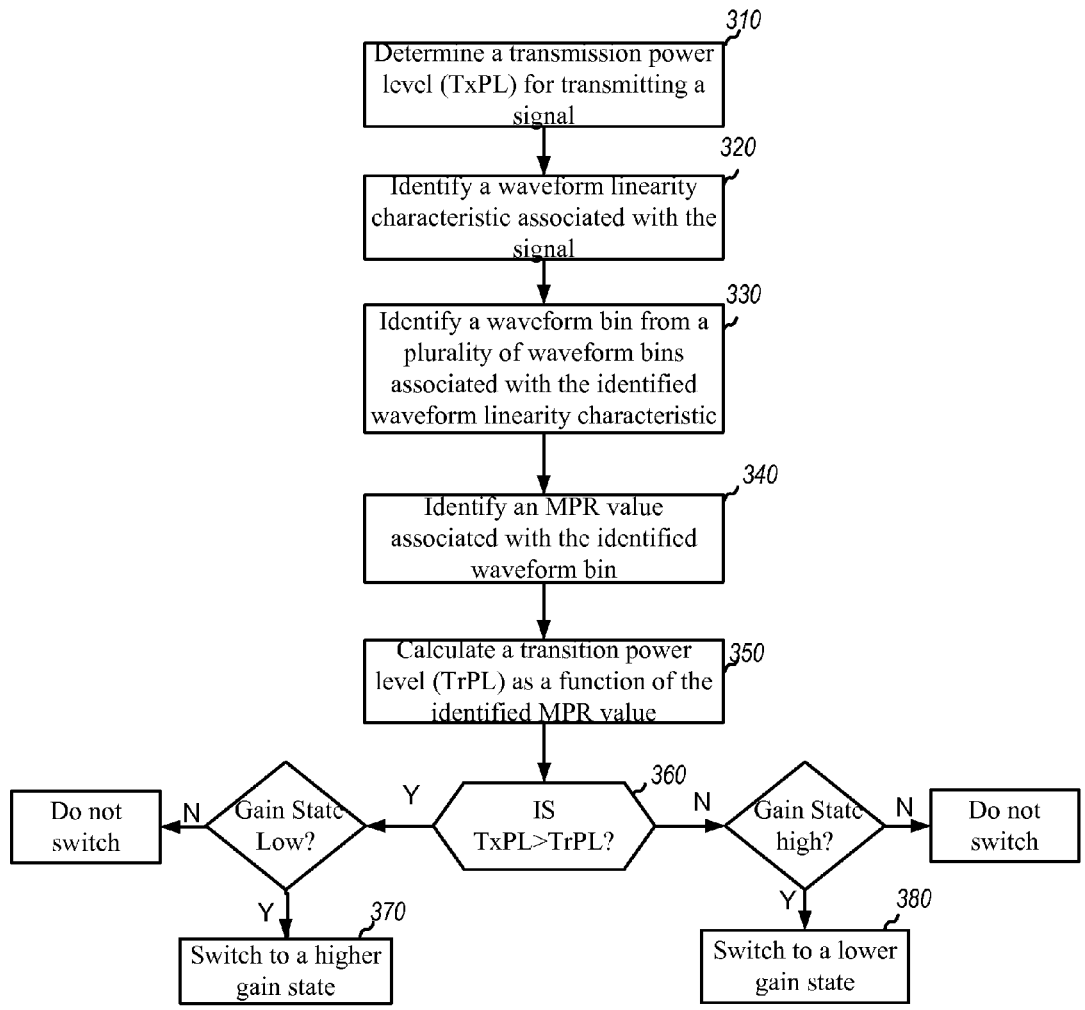
FIG. 4 is a flow diagram for calculating and switching between gain states of a multi-gain state power amplifier in accordance with the exemplary embodiment.

FIG. 4 is a flow diagram for calculating and switching between gain states of a multi-gain state power amplifier in accordance with the exemplary embodiment.

In the exemplary embodiment of FIG. 4, a transmission power level for transmitting a signal is initially determined (step 310). In step 320, a waveform linearity characteristic associated with the signal is identified. Next, at step 330, a waveform bin is identified, from a plurality of waveform bins, associated with the identified waveform linearity characteristic. Each waveform bin is associated with an MPR value. Accordingly, at step 340, the MPR value associated with the identified waveform bin is identified. At a next step 350, at least one new transition power level (new switch point) between two gain states is calculated as a function of the identified MPR value.

The function follows the following rule:

Let the transition power level for MPR=0 dB waveforms=x dBm.

Then the specific transition power level for each waveform bin is a function of the MPR value according to the following equation:

$$\text{Transition power level}(dBm) = x dBm - MPR(dB)$$

After the transition power level has been calculated, it is compared to the transmission power level, at step 360.

The decision, now, whether the PA will switch to a different gain state is a function of the calculated transition power level, the transmission power level and the gain state where the PA is already at.

If the PA is at a lower gain state and the transmission power level is greater than the transition power level, then the PA switches to a higher gain state, as in step 370.

If the PA is at a lower gain state and the transmission power level is lower than the transition power level, then the PA stays at the lower gain state, as in step 380.

If the PA is at a higher gain state and the transmission power level is greater than the transition power level, then the PA stays at the higher gain state.

If the PA is at a higher gain state and the transmission power level is lower than the transition power level, then the PA switches to a lower gain state.

By dynamically calculating the transition power level as a function of the MPR value, the PA stays longer at a lower gain state and switches faster to a lower gain state. If the MPR value of the specific waveform bin was not employed in the equation then the PA would, typically, switch faster to a higher gain state or stay longer at a higher gain state. Therefore, the introduction of the MPR value in the equation of calculating the transition power level optimizes the gain state switching of the PA thus reducing the current used by the PA, prolonging the battery duration and the talk time of the UE.

In a further step, a special waveform bin is assigned to signals of a particular type, such as voice, that intrinsically have a better waveform linearity characteristic compared to waveform linearity characteristics of other types of signals, such as data. The waveform bin for voice signals has an MPR value=−1 dB.

Those of skill will appreciate that the method can be extended to include any transmit or receiver waveform linearity metric other than MPR, cubic metric or peak to average as data packet based protocols may evolve.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A device for controlling a multi-gain state power amplifier (PA) having at least two power paths with respective gain states for amplifying a transmit signal, comprising:
   an MPR module to calculate a transition power level between a lower gain state and a higher gain state of different power paths as a function of a maximum power reduction (MPR) value associated with the transmit signal; and
   a PA gain controller to switch the PA to the higher gain state from the lower gain state when a transmission power level is higher than the transition power level.

2. The device of claim 1, where the MPR module uses a metric to identify the MPR value.

3. The device of claim 2, where the PA gain controller compares the transmission power level to the transition power level to determine the optimum gain state for minimizing current consumption of the PA.

4. An integrated circuit (IC) for controlling a multi-gain state power amplifier (PA) having at least two power paths with respective gain states for amplifying a transmit signal, the IC comprising:
- an MPR module to calculate a transition power level between different PA gain states of different respective power paths as a function of an MPR value associated with the transmit signal; and
- a PA gain controller to switch the PA to a higher gain state from a lower gain state when a transmission power level is higher than the transition power level.

5. The IC of claim 4, where the MPR module uses a metric to identify the MPR value.

6. The IC of claim 5, where the PA gain controller compares the transmission power level to the transition power level to determine the optimum gain state for minimizing current consumption of the PA.

7. The device of claim 1, wherein the device is a wireless communication device.

8. The device of claim 1, wherein the MPR module identifies a waveform bin, from a plurality of waveform bins, associated with an identified waveform linearity characteristic, and determines the MPR value according to the identified waveform bin.

9. The IC of claim 4, wherein the MPR module identifies a waveform bin from a plurality of waveform bins associated with an identified waveform linearity characteristic, and determines the MPR value according to the identified waveform bin.

10. A device for controlling a multi-gain state PA having at least two power paths with respective gain states for amplifying a transmit signal comprising:
- means for calculating a transition power level between different gain states of different respective power paths as a function of an identified MPR value; and
- means for switching the PA to a higher gain state from a lower gain state when a transmission power level is higher than the calculated transition power level.

11. The device of claim 10, further comprising means for switching to a lower gain state from a higher gain state when a transmission power level is lower than the calculated transition power level.

12. The device of claim 10, further comprising means for identifying the MPR value associated with an identified waveform bin.

13. A device for controlling a multi-gain state PA having at least two gain states for amplifying a transmit signal comprising:
- means for identifying a waveform bin, from a plurality of MPR bins, associated with an identified waveform linearity characteristic;
- means for identifying an MPR value associated with the identified waveform bin;
- means for calculating a transition power level as a function of the identified MPR value; and
- means for switching the PA to a higher gain state from a lower gain state when a transmission power level is higher than the calculated transition power level.

14. The device of claim 13, further comprising means for identifying the waveform linearity characteristic associated with the transmit signal.

15. The device of claim 14, further comprising means for determining the transmission power level for transmitting the transmit signal.

16. The device of claim 15, further comprising means for assigning an MPR value to a waveform bin according to the type of the transmit signal.

17. The device of claim 16, where the MPR value=−1 dB when the transmit signal is voice.

18. A method of controlling a multi-gain state PA having at least two power paths with respective gain states for amplifying a transmit signal, comprising:
- calculating a transition power level between different gain states of different respective power paths as a function of an identified MPR value; and
- switching the PA to a higher gain state from a lower gain state when a transmission power level is higher than the calculated transition power level.

19. The method of claim 18, further comprising switching to a lower gain state from a higher gain state when a transmission power level is lower than the calculated transition power level.

20. The method of claim 18, further comprising identifying the MPR value associated with an identified waveform bin.

21. A method of controlling a multi-gain state PA having at least two gain states for amplifying a transmit signal, comprising:
- identifying a waveform bin from a plurality of waveform bins associated with an identified waveform linearity characteristic;
- identifying an MPR value associated with the identified waveform bin;
- calculating a transition power level as a function of the identified MPR value; and
- switching the PA to a higher gain state from a lower gain state when a transmission power level is higher than the calculated transition power level.

22. The method of claim 21, further comprising identifying the waveform linearity characteristic associated with the transmit signal.

23. The method of claim 22, further comprising determining the transmission power level for transmitting the transmit signal.

24. The method of claim 22, further comprising assigning an MPR value to a waveform bin according to the type of the transmit signal.

25. The method of claim 24, wherein the MPR value=−1 dB when the transmit signal is voice.

26. A computer program product for use with a processor device that controls a multistage PA having at least two power paths with respective gain states for amplifying a transmit signal, the computer program product having instructions to cause the processor device to:
- calculate a transition power level between different gain states of different respective power paths as a function of an identified MPR value; and
- switch the PA to a higher gain state from a lower gain state when a transmission power level is higher than the calculated transition power level.

27. The computer program product of claim 26, wherein the instructions further cause the processor device to:
- identify a waveform bin, from a plurality of waveform bins, associated with an identified waveform linearity characteristic; and
- identify the MPR value associated with the identified waveform bin.

* * * * *